(12) United States Patent
Deppisch et al.

(10) Patent No.: US 7,531,071 B2
(45) Date of Patent: May 12, 2009

(54) MAGNET ARRANGEMENT FOR A PLANAR MAGNETRON

(75) Inventors: Thomas Deppisch, Aschaffenburg (DE); Andreas Lopp, Freigericht (DE)

(73) Assignee: Applied Materials GmbH & Co. KG., Alzenau (DE)

( * ) Notice: Subject to any disclaimer, the term of this patent is extended or adjusted under 35 U.S.C. 154(b) by 94 days.

(21) Appl. No.: 11/385,042

(22) Filed: Mar. 20, 2006

(65) Prior Publication Data

US 2006/0219550 A1 Oct. 5, 2006

(30) Foreign Application Priority Data

Apr. 5, 2005 (EP) .................................. 05007339

(51) Int. Cl.
*C23C 14/34* (2006.01)

(52) U.S. Cl. ............................. 204/298.19; 204/298.2

(58) Field of Classification Search ............ 204/298.16, 204/298.2, 298.19
See application file for complete search history.

(56) References Cited

U.S. PATENT DOCUMENTS

| | | | |
|---|---|---|---|
| 4,437,966 A | 3/1984 | Hope et al. | |
| 4,826,584 A * | 5/1989 | dos Santos Pereiro Ribeiro | ................ 204/298.09 |
| 5,026,471 A | 6/1991 | Latz et al. | |
| 5,182,003 A | 1/1993 | Maass et al. | |
| 5,458,759 A | 10/1995 | Hosokawa et al. | |
| 5,512,872 A | 4/1996 | Ohashi | |
| 5,736,019 A * | 4/1998 | Bernick | ................ 204/298.07 |
| 6,464,841 B1 | 10/2002 | Hurwitt | |
| 2005/0145478 A1* | 7/2005 | Tepman | ................ 204/192.12 |
| 2005/0178660 A1* | 8/2005 | Lopp et al. | ................ 204/298.2 |

FOREIGN PATENT DOCUMENTS

DE 41 02 102 A1 8/1992

(Continued)

OTHER PUBLICATIONS cf. Q. H. Fan, L. Q. Zhou and J. J. Gracio, A cross-corner effect in a rectangular sputtering magnetron. J. Phys. D: Appl. Phy. 36 (2003), 244-251.*

(Continued)

*Primary Examiner*—Alexander Noguerola
*Assistant Examiner*—Dustin Q Dam
(74) *Attorney, Agent, or Firm*—Fulbright & Jaworski L.L

(57) ABSTRACT

A magnetic arrangement for a planar magnetron, in which an initial magnetic pole encompasses a second magnetic pole. This magnetic arrangement is moved linear in longitudinal direction to a target by a specific value and then moved back in opposite direction by the same value. In one version, an additional perpendicular motion is effected. The magnet arrangement is designed so that north and south pole interlock and waviform racetracks are generated. This enables constant sputtering from the entire target surface.

11 Claims, 4 Drawing Sheets

FOREIGN PATENT DOCUMENTS

| | | |
|---|---|---|
| DE | 197 01 575 A1 | 7/1998 |
| EP | 0 105 407 B1 | 4/1984 |
| EP | 0 242 826 B1 | 10/1987 |
| EP | 0 820 088 A2 | 1/1998 |
| EP | 1 184 480 | 3/2002 |
| GB | 2 409 581 A | 6/2005 |
| JP | 63317671 A | 12/1988 |
| TW | 444065 B | 7/2001 |
| TW | 454048 | 9/2001 |
| TW | 554058 | 9/2003 |

OTHER PUBLICATIONS

Fan et al. "A Cross-Corner Effect In A Rectangular Sputtering Magnetron" J. Phys. D: Appl: Phys. 36 (2003) pp. 244-251.*

Fan, et al. "A Cross-Corner Effect in a Rectangular Sputtering Magnetron", J. Phys. D: Appl. Phys. (2003).

* cited by examiner

MAGNET ARRANGEMENT FOR A PLANAR MAGNETRON

BACKGROUND AND SUMMARY OF THE INVENTION

This application claims priority under 35 U.S.C. §119 from European Patent Application No. 050 07 339 filed Apr. 5, 2005, incorporated herein by reference in its entirety.

The invention relates to an arrangement of magnets.

In a sputter system, plasma is generated in a sputter chamber under vacuum. The plasma is understood to be a quasi-neutral many-particle system in the form of gaseous blends of free electrons and ions as well as possible neutral particles, i.e. atoms, molecules or radicals. Positive ions of the plasma are attracted by the negative potential of a cathode, which features a so-called target. The positive ions impinge upon this target and knock away small particles that subsequently precipitate on a substrate. The knocking away of these particles is referred to as "sputtering." The plasma contains ionized gases, which can, for example, be inert gases such as argon, in the event of a non-reactive sputtering. In the event of a reactive sputtering, for example, oxygen is either used by itself or in conjunction with an inert gas.

The ions required for the sputtering process are generated through the collisions of gas atoms and electrons in a glow discharge and accelerated into the target forming the cathode with the assistance of an electric field.

In conventional DC and HF sputtering, only few secondary electrons, emitted on sputtering the target, contribute to the ionization of the sputter gas atoms.

To improve the sputter effect, magnets are utilized near the target. Their magnetic field keeps the plasma at the target. Through the interaction of the magnetic and the electric fields the charge carriers in the plasma primarily no longer move parallel to the electric field but also at right angles to it, which results in cycloid electron trajectories. As the deflection radii of the electrons are much smaller than those of the ions, due to their low mass, the electrons concentrate before the target surface. Therefore, the probability that sputter gas atoms are ionized via collisions with electrons is much higher. As a result of the E×B drift of the electrons—the electrons follow a trajectory referred to as racetrack—and the concentration of plasma before the target surface, the electrons no longer fly directly to the substrate. Heating of the substrate is therefore reduced.

The much heavier ions fall onto the target, which has the effect of a negative electrode or cathode and sputter this. Ionizations therefore largely occur where the magnetic field vector is parallel to the target surface. The plasma is most dense here, as a result of which the target is most strongly eroded at this point. The glow discharge plasma is virtually enclosed by the magnetic field and the electron trajectories are extended by the fact that the electrons rotate around the magnetic field lines serving as axes, thereby increasing the rate at which gas atoms and electrons collide.

To coat larger areas, planar magnetrons are generally used. These, however, have a lower target utilization, e.g. of 40% or less.

As a result, rotating cylinder magnetrons, which achieve a target utilization of 90% and more, have been used more frequently in recent times.

A disadvantage which both cylinder magnetrons, which are occasionally also referred to as pipe cathodes, and planar magnetrons feature is the irregular wear of the targets. Pipe cathodes are less sputtered on the edges where in fact a re-coating can occur. So-called racetracks form in the planar magnetrons, i.e. trenches from erosion caused by the arrangement of the magnets in the magnetrons. These erosion trenches are directly generated by the colliding ionized gas particles. These hit the target, acting as a negative electrode or cathode and serving as a sputter, in an irregular way. The plasma trajectory determined by the magnetic field—which correlates with the electron trajectories—or the racetrack, in particular delimits the target utilization of planar magnetrons; when the target is fully eroded at a given point, it can no longer be used, even if there is still sufficient material at other points. Although even a cylinder magnetron has a plasma racetrack when stationary, which corresponds with the configuration of the magnets, no trench-like depression is formed on the rotating target.

Apart from the tube-like racetrack erosion, the rectangular planar magnetrons with straight racetracks additionally feature a so-called cross corner effect, which also delimits utilization of the target. Cross corners are the diagonally opposite corners of a rectangular magnetron. If the magnetic field in a terminal region of the magnetron cathode differs from the magnetic field in the central area, e.g. is weaker, the electrons drift faster in this terminal region than in the middle, i.e. they quickly arrive in the cross corner area. This causes electron congestion in this area, which results in a denser ionization and subsequently in increased erosion of the target. (cf. Q. H. Fan, L. Q. Zhou and J. J. Gracio, A cross-corner effect in a rectangular sputtering magnetron. J. Phys. D: Appl. Phy. 36 (2003), 244-251).

A magnetron sputter system already exists in which double T-shaped magnets of an initial polarity are surrounded by rectangular framework magnets of a second polarity (U.S. Pat. No. 5,458,759). This makes use of the arrangement of the magnets to achieve a consistent as possible wear of the target.

Another procedure is also based on the assumption that the arrangement of magnets causes the erosions on the target (DE 197 01 575 A1). In so doing, it suggests the positioning of a substrate in a direction perpendicular to the lengthwise direction of the cathode, while the magnets of the cathode are arranged so that they form two closed loops of a sputtering erosion surface area and can be moved perpendicular to the lengthwise direction of the cathode.

Furthermore, a sputter system exists with magnets that are arranged in a meander-like fashion (EP 0 105 407, FIG. 5). This generates a pre-determined plasma sputtering area in the form of a meandering electron trajectory, which guarantees a relatively constant wear of the target. With this sputter system, no relative movement of target and magnet system occurs. As a result, a re-coating between the individual meander loops can occur and the target—which is larger than the substrate—cannot be fully sputtered.

Another existing magnetron sputtering cathode features an internal magnetic south pole with a central bar from which tongues extend outwards at right angles in regular intervals (EP 0 242 826 B1=U.S. Pat. No. 4,826,584). Here the exterior magnetic north exists of a rectangular framework, from the lengthwise sides of which tongues extend inwards at right angles that are arranged so that they lie between two tongues each of the magnetic south. This results in a meander-shaped magnetic field and thus a meander-shaped erosion zone. The tongues of the south pole are all parallel to each other. Once again, with this sputtering cathode there is no relative movement between the target and the magnetic system.

A magnet arrangement for a sputter system also exists in which a magnetic north framework surrounds a linear south pole (Patent Abstracts of Japan, Vol. 013, no. 169 (C-587) & JP 63317671 A, FIG. 8). Between this north and south pole there are further north and south poles to the right and the left of the linear south pole, which, however are not connected to this south pole.

Furthermore, a magnet arrangement for a sputter system exists in which a largely ring-shaped north pole surrounds a linear south pole and in which the end of the south pole has arms extending to the north pole (U.S. Pat. No. 5,182,003). These arms are, however, not offset against each other.

Finally, a magnet arrangement for a sputter system exists in which an initial oval magnetic pole surrounds a second linear magnetic pole (U.S. Pat. No. 5,026,471). Neither of the two magnetic poles has arms extending from it.

The invention is based on the task of optimally utilizing large targets by means of a suitable management of erosion trenches and to keep the target as free as possible of re-deposits.

This problem is solved according to the present invention.

The invention thus pertains to a magnet arrangement for a planar magnetron in which an initial magnetic pole encompasses a second magnetic pole. This magnet arrangement is moved linear in lengthwise direction to a target by a specific value, and then moved back in the opposite direction by the same value. In one version an additional perpendicular movement is also effected. The magnet arrangement is designed so that the north and south poles interlock to form waviform racetracks. As a result, constant sputtering from the entire target surface can be effected.

The benefit achieved by the invention consists of the fact that large and plane targets with only a single erosion trench can be coated so that more than 50% of its surface is covered by the erosion trenches. Through the relative movement between the target and magnet system this results in a homogeneous erosion profile. Through the slight interlocking of opposing magnetic pole elements sputtering is also effected in the middle of the target.

If the invention is advantageously designed, even long, wide targets with only a single racetrack or erosion track can be coated. As the two poles of the magnet arrangement interlock slightly in the middle, it is possible to achieve a high target utilization and a virtually complete re-coating free target surface with only one linear movement. In so doing, north and south pole are arranged relatively to each other so that meander-like racetracks are achieved on the target. Two opposing meanders are so close to one another that the target surface is evenly sputtered when executing a linear movement toward the target length. The height of lift is ± half a meander interval.

Embodiment examples of the invention are shown in the drawings and are subsequently described in more detail.

DETAILED DESCRIPTION

Figure 1:
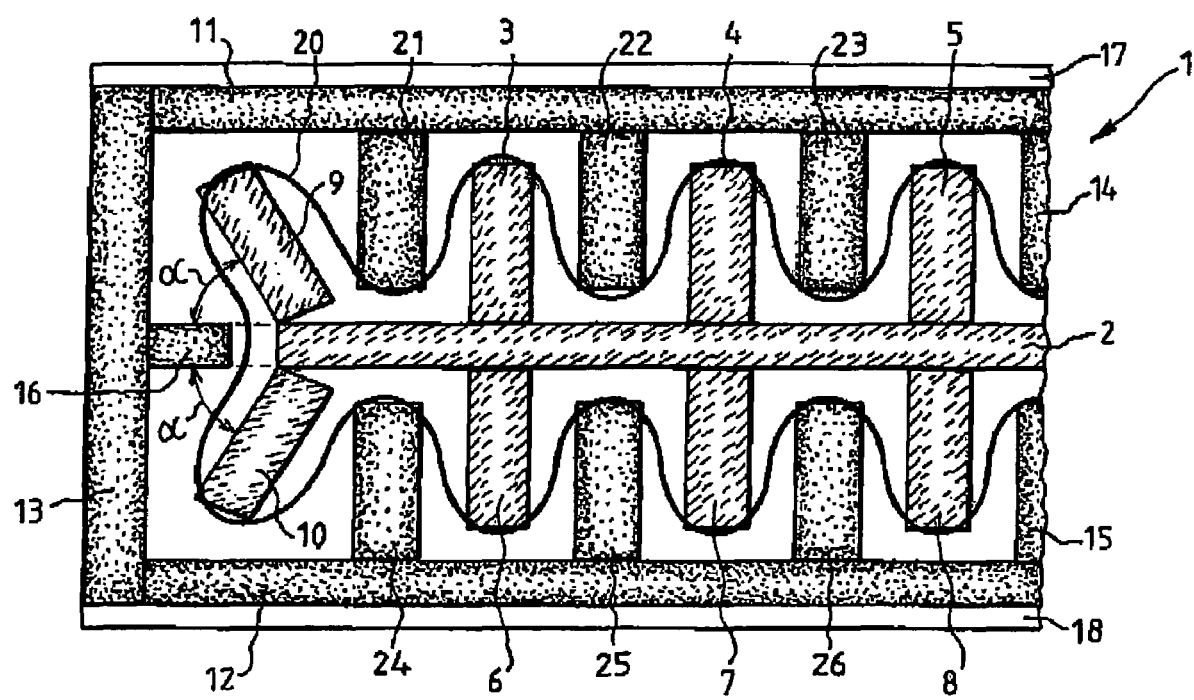
FIG. 1 is a partial representation of an initial magnet arrangement in a planar magnetron.

FIG. 1 shows a partial representation of an initial magnet configuration 1 in accordance with the invention, with which constant utilization of a target is enabled. In so doing, movements in two different directions are, however, required. On the one hand, the magnet system must be moved along the length of the target and, on the other, an additional movement along the target width is required, so that no re-coating is obtained. The magnet configuration 1 shown in FIG. 1 continues on the right side (not shown) in a reversed image. The magnetic south pole of the magnet configuration consists of a transverse bar 2, on which arms 3 to 8 are arranged parallel to each other and perpendicular to bar 2.

On the one end of bar 2, two additional arms 9, 10 of the magnetic south are provided for, the longitudinal axis of which is arranged at an angle α to the longitudinal axis of the perpendicular bar 2. The angle α is approx. 60°. At the end of the right and not displayed side of bar 2 there are also arms that extend diagonally and correspond with arms 9 and 10, which are, however not extended to the left but the right. These arms on the right are arranged mirror symmetrically to arms 9 and 10.

The north pole of magnet configuration 1 is arranged around the south pole like a frame, while an upper and a lower frame segment 11 and 12 as well as a left lateral frame segment 13 are discernible. The right lateral frame segment, corresponding with segment 13 is not depicted. In the middle of the left frame segment 13 an arm 16 is provided for, which is opposite to the left end of bar 2. Correspondingly, an arm is provided for on the right side, which corresponds to arm 16.

Between the two arms 9, 3; 3, 4; 4, 5; 10, 6; 6, 7; 7, 8 of bar 2 are tongues 21 to 23, 14 and 24 to 26, 15, which are perpendicular to frame segment 11 or 12 and oriented inwards.

The north and south pole of magnet configuration 1 are connected at the back with a yoke plate 17, 18. Line 20 indicates the erosion track generated on the back of a target, which is not shown in FIG. 1.

When static, i.e. when magnet configuration 1 and the target do not move relative to each other, erosion track or racetrack 20 form a single meander. To optimally utilize the target, magnet yoke 17, 18 must be moved along the target length with magnet configuration 1 to determine the meanders. In addition, a movement along the target width is required so that no re-coating occurs in the middle of the target.

The arrangement of magnets 9, 10 and 16 serves to remove or reduce the cross corner effect. Following a longer straight segment of racetrack, a cross corner effect can occur following a subsequent curve. On a straight racetrack alone, no cross corner effect will arise. This effect only occurs at two opposite sides of the target, where electrons come across a straight segment after a curve (cf. FIG. 7B in DE 197 01 575 A1). The invention described here does not have a racetrack consisting of an extended straight segment, it is always curved. If one omits magnet arm 16 and positions magnets 9 and 10 in parallel with the other magnets, the racetrack is briefly straight along the target width and a cross corner effect is to be expected.

Figure 2:
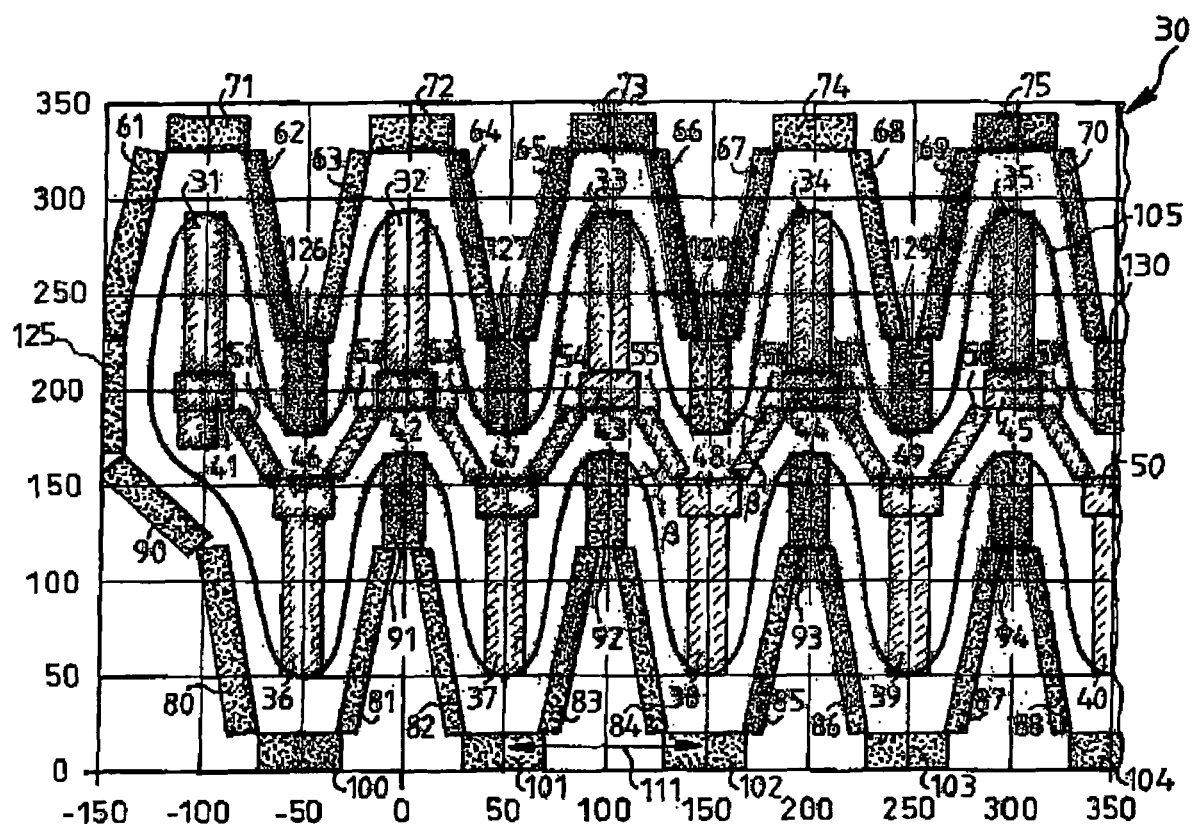
FIG. 2 is a partial representation of a second magnet arrangement in a planar magnetron.

FIG. 2 depicts a second magnet configuration 30 with which only one movement along the target length is required. A movement along the target width is not required. In so doing, the movement of magnet configuration 30 is effected linear along the length of a target. At the end of a target, a return movement occurs.

One of the poles of magnet configuration 30, e.g. the south pole has equidistant upper arms 31 to 35 and equidistant lower arms 36 to 40. The longitudinal axes of the lower arms 36 to 40 are parallel to the longitudinal axes of the upper arms 31 to 35, however, they are laterally offset so that they run through a point that marks the middle between the longitudinal axes of upper arms 31 to 35.

The ends of arms 31 to 35 or 36 to 40, that are inwards oriented end in rectangular blocks 41 to 45 and 46 to 50, which are connected to connection elements 51 to 59 that create a connection between blocks 41 to 45 and blocks 46 to 50. These connection elements 51 to 59 are arranged at an angle β to the longitudinal axes of arms 31 to 35 and 36 to 40.

As a result, all components of the south pole are magnetically connected.

The other pole, e.g. the north pole of magnet configuration 30 is formed by several hood-like sub-magnets, which each encompass an arm 31 to 35 or 36 to 40 of the south pole. These sub-magnets feature two sides 61, 62 or 63, 64 or 65, 66 or 67, 68 or 69, 70 each that are arranged diagonally to the center axis of arms 31 to 35 and 36 to 40, the upper ends of which are connected to each other by means of blocks 71 to 75, the longitudinal axes of which is horizontal. The lower ends of sides 61 to 70 are also connected with blocks 125 to 130, which have vertically oriented longitudinal axes. The lower sub-magnets are also arranged in correspondence with the upper sub-magnets of the north pole described. The ends of sides 80 to 88 adjoin to blocks 90 to 94 and 100 to 104. The former blocks 90 to 94 are vertically oriented while the latter blocks 100 to 104 are oriented horizontally.

The racetrack forming when static, i.e. without relative movement between magnet configuration 30 and the target, is designated as 105 and forms two superimposed wave curves similar to a sinus curve.

FIG. 2 not only shows the north and south poles but also the position of the zero-crossing of the perpendicular component of the magnetic field on the target surface. The direction in which magnet configuration 30 is moved relative to a target is indicated by a double arrow 111. This arrow shows that the movement is only effected in the longitudinal direction of the target, namely once to the right and subsequently to the left, etc. In so doing, the stroke length is ± half a meander interval. In this case the meander interval is considered to be the interval between two peaks of a sinus-like wave 105. The size of double arrow 111 corresponds approximately with the meander interval.

The information on the y-axis and x-axis are provided in mm, which are of no relevance to the invention. They merely indicate the spatial size of a realisable magnet arrangement.

As a result of the design of magnet configuration 30, which is asymmetrical to the center axis, sputtering is also effected in the center area; however, re-coating is effected between the loops. It is only through the movement of the magnetic field along the target length that a re-coating free target surface occurs, with the exception of the edges of the target.

With magnet configuration 30, a re-coating area arises at the top and bottom of the target. This re-coating area is not desired and can be reduced, e.g. through targets in the form of a parallelogram. However, it can also be reduced by positioning the meanders at an angle.

Figure 3:
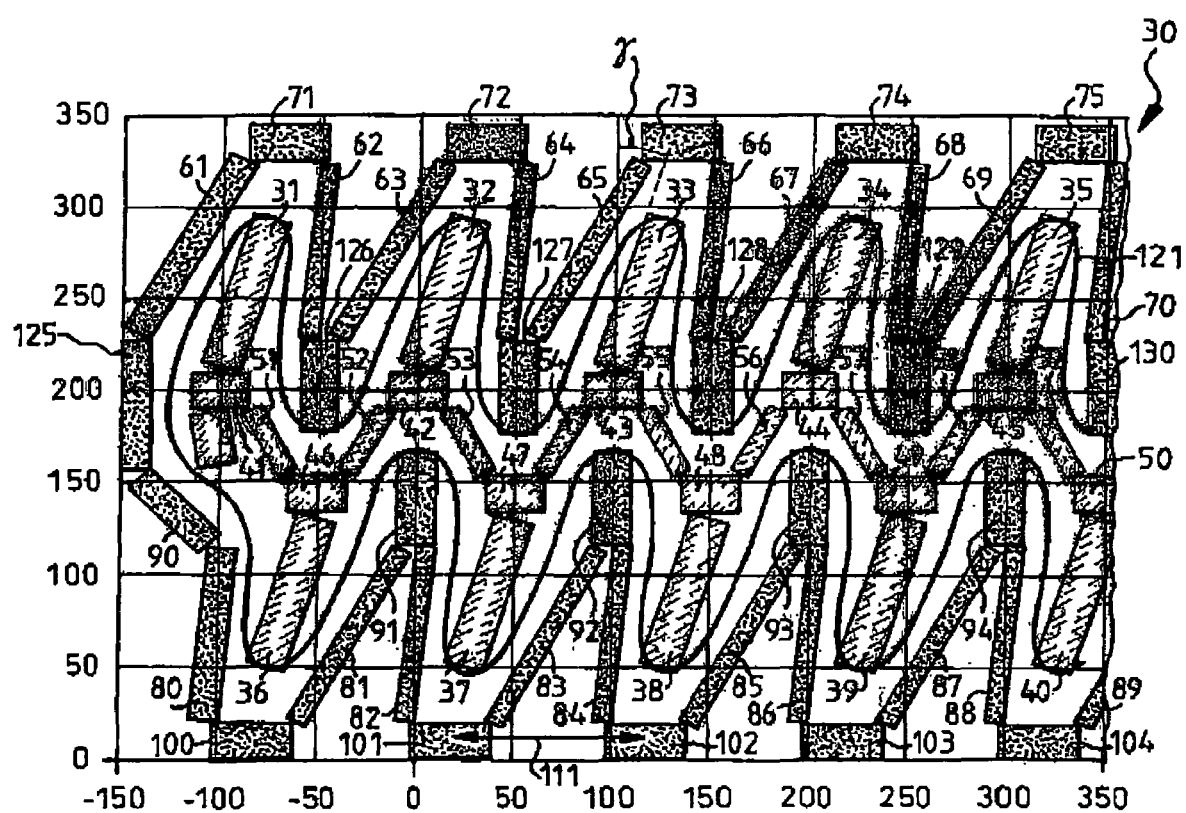
FIG. 3 is a partial representation of a third magnet arrangement in a planar magnetron.

Magnet configuration 120, in which the meanders are positioned at an angle, is depicted in FIG. 3. As the number of magnetic elements and their basic arrangement is the same as the one in FIG. 2, these magnetic elements have the same designations as in FIG. 2. In this case, arms 31 to 40 are inclined by an angle γ to the perpendicular. This results in two sinus-like wave curves arranged on top of each other, as racetrack 121. Through the inclination of the meanders it is possible to reduce re-coating at the two ends of the target.

Magnet configuration 120 of FIG. 3 is moved relative to the target in the same manner as magnet configuration 30 of FIG. 2.

Figure 4:
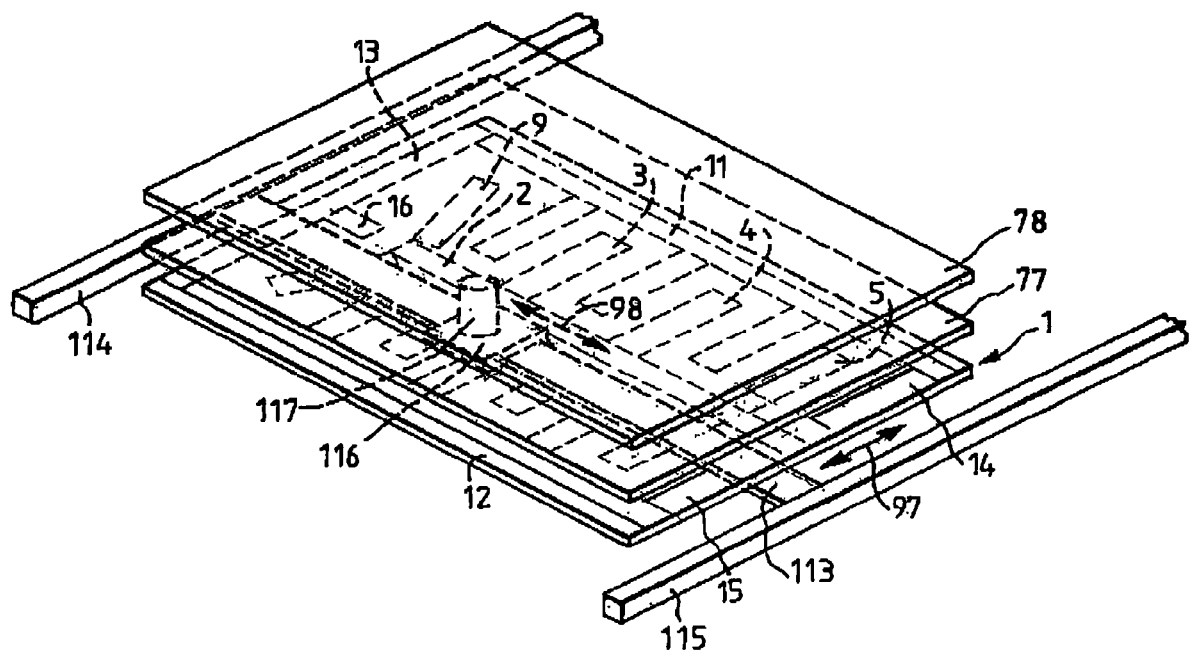
FIG. 4 is a representation of a magnet arrangement together with a target and a substrate.

FIG. 4 schematically depicts an arrangement, which not only comprises magnet configuration 1 but also a target 77 and a substrate 78. The magnet configuration is the same as in FIG. 1, which is why the individual magnet elements feature the same designations.

Target 77 and substrate 78 are solidly arranged in a sputter chamber not depicted. However, below target 77, magnet configuration 1 with yoke 17, 18, can be moved towards the arrows 97, 98. A carrier plate 113 connected to a drive not depicted, is provided for this purpose, the ends of which are guided by tracks 114, 115. A slide 116 is arranged on this carrier plate 113, which carries magnet configuration 1 via a pillar 117. As the slide 116 can be moved towards arrow 98, the magnet configuration 1 can be moved relative to target 77, as required.

With the above embodiment examples of the invention the targets are longer than the magnet construction as the magnets are moved along the target length. The target width, however, is smaller than the width of the magnet arrangement. The size of the target is determined by the size and form of the racetrack and the movement.

The invention claimed is:

1. A magnet arrangement for a planar magnetron in which an initial magnetic pole, designed as a rectangular frame, comprises a second magnetic pole designed as a linear bar and in which the linear bar has several perpendicular arms on its longitudinal axis, wherein two arms each are provided for at the ends of the bar, which are located at an angle (α) of approximately 60° to the longitudinal axis of the bar.

2. The magnet arrangement of claim 1, wherein the initial magnetic pole is a rectangular frame, which has several arms which are oriented to the bar of the second magnetic pole.

3. The magnet arrangement of claim 2, wherein two of the arms of the frame are located on the imaginary extension of the longitudinal axis of the bar and have a certain distance to this bar.

4. The magnet arrangement of claim 1, wherein several arms are located at right angles on the longitudinal axis of the linear bar.

5. The magnet arrangement of claim 1, wherein longitudinal axes from arms of the frame and longitudinal axes from arms of the bar are parallel to each other.

6. The magnet arrangement of claim 1, wherein arms of the frame and arms of the bar interlock.

7. The magnet arrangement of claim 1, wherein the magnetic arrangement is part of the magnetron of a sputter system.

8. The magnet arrangement of claim 7, wherein the magnetic arrangement is located near a target.

9. The magnet arrangement of claim 8, wherein the target lies opposite a substrate.

10. The magnet arrangement of claim 1, wherein the magnetic arrangement can be moved relative to a target.

11. The magnet arrangement of claim 10, wherein the magnetic arrangement can be moved in x or y direction, relative to the target.

* * * * *